United States Patent
Van Den Homberg et al.

[11] Patent Number: 6,140,875
[45] Date of Patent: Oct. 31, 2000

[54] DEVICE FOR AMPLIFYING DIGITAL SIGNALS

[75] Inventors: Johannes A. T. M. Van Den Homberg; Kathleen J. P. Philips, both of Eindhoven, Netherlands

[73] Assignee: U.S. Philips Corporation, New York, N.Y.

[21] Appl. No.: 09/129,498

[22] Filed: Aug. 5, 1998

[30] Foreign Application Priority Data

Aug. 12, 1997 [EP] European Pat. Off. .............. 97202484

[51] Int. Cl.$^7$ ................................................ H03F 3/217
[52] U.S. Cl. ............................................. 330/251; 330/10
[58] Field of Search ..................... 330/251, 10, 207 A, 330/9

[56] References Cited

U.S. PATENT DOCUMENTS

| | | | |
|---|---|---|---|
| 4,059,807 | 11/1977 | Hamada | 330/10 |
| 4,554,512 | 11/1985 | Aiello | 330/10 |
| 5,410,592 | 4/1995 | Wagner et al. | 330/251 |
| 5,521,549 | 5/1996 | Nelson | 330/10 |
| 5,617,058 | 4/1997 | Adrian et al. | 330/251 |
| 5,815,581 | 9/1998 | Andersson | 330/251 |

OTHER PUBLICATIONS

"A Sigma–Delta Power Amplifier for Digital Input Signals" by Audio Engineering Society, held from Mar. 22 to Mar. 25, 1997.

*Primary Examiner*—Robert Pascal
*Assistant Examiner*—Khanh Van Nguyen
*Attorney, Agent, or Firm*—Edward W. Goodman

[57] ABSTRACT

The device for amplifying digital signals includes an input electrode (10) for receiving a digital signal. The device further includes a subtraction unit (12) for subtracting at least two signals from each other, and the input electrode (10) is coupled to a first input (11) of the subtraction unit (12). The device also includes a time-continuous loop filter (14) coupled to an output of the subtraction unit (12), and a time-continuous comparator (16) and a switching amplifier (18) which are coupled in cascade to the time-continuous loop filter. The device additionally includes an output electrode (20) which is coupled to an output (22) of the switching amplifier (18). This output (22) of the switching amplifier (18) is also coupled to a second input (13) of the subtraction unit (12).

3 Claims, 3 Drawing Sheets

DEVICE FOR AMPLIFYING DIGITAL SIGNALS

BACKGROUND OF THE INVENTION

1. Field of the Invention

The invention relates to a device for amplifying digital signals comprising an input electrode for receiving a digitally encoded signal, the device also comprising a subtraction unit for subtracting at least two signals from each other, the input electrode being coupled to a first input of the subtraction unit, and said device further comprising a cascade arrangement of a loop filter, a comparator and a switching amplifier, this cascade arrangement being coupled to an output of said subtraction unit, and said device also including an output electrode which is coupled to an output of the switching amplifier, said output of the switching amplifier also being coupled to a second input of the subtraction unit.

The invention further relates to a bridge amplifier comprising at least two such devices, and to an integrated circuit provided with such a device.

2. Description of the Related Art

Such a device is known from preprint 4448 (G6) of the $102^{nd}$ convention of the Audio Engineering Society, held from Mar. 22 to Mar. 25, 1997. This publication is entitled "A Sigma-Delta Power Amplifier for Digital Input Signals". By means of such a device, a digital input signal, for example, a pulse-density-modulated audio signal, can be converted to an amplified output signal. To achieve this, the device comprises a switching amplifier which is controlled by a comparator. To reduce the sensitivity of this switching amplifier to variations, for example, in the supply voltage, the amplified output signal is fed back to the input. This feedback causes the control of the switching amplifier by the comparator to be influenced in such a manner that, in case of variations in the supply voltage of the switching amplifier, the output signal is corrected. This correction can be carried out, for example, in such a manner that the low-frequency contents of the output signal remains substantially the same. Such devices further include a loop filter which should provide for a maximum loop gain at low frequencies, while the loop gain at the sampling frequency should be below one so as to preclude oscillations. The latter condition can be met by constructing the device in such a manner that the high-frequency portion of the input current is larger than the high-frequency portion of the feedback current. To ensure that such a device operates in a stable manner, it is also necessary that the loop gain at a frequency close to the frequency at which the loop gain is equal to one is in accordance with a first-order characteristic. To achieve the above-mentioned requirements, use is generally made of a loop filter which ensures that the loop gain of the device at low frequencies is in accordance with a higher-order characteristic, so that a relatively high loop gain is obtained, and said loop filter also ensures that, from a certain transition frequency, said loop gain is in accordance with a first-order characteristic, the loop gain at the transition frequency being greater than one.

The device known from the above-mentioned publication includes a clocked loop filter and a clocked comparator. As a result, in the case of variations, for example, in the supply voltage, the output signal is corrected by adding or leaving out pulses. In the known device, adding or leaving out pulses causes quantization noise in the output signal, which leads to a decrease in dynamic range. This quantization noise can be reduced in a specific frequency range of the output signal by means of a relatively complex and expensive loop filter, so that an increase in dynamic range is obtained.

SUMMARY OF THE INVENTION

It is an object of the invention to provide a device for amplifying digital signals as mentioned in the opening paragraph, in which a relatively simple and inexpensive loop filter can be used, which does not adversely affect the dynamic range.

To achieve this, the device in accordance with the invention is characterized in that the loop filter comprises a time-continuous filter and the comparator comprises a time-continuous comparator. As a result, in the case of variations, for example, in the supply voltage, the output signal is corrected by widening or narrowing the pulses. The invention is based on the recognition that in the known device, the quantization noise is caused by the clocked character of the comparator, since, due to this, pulses can only be added or left out at discrete points in time. In the device in accordance with the invention, both the loop filter and the comparator are time-continuous, so that the widening or narrowing of pulses does not lead to quantization errors. As quantization noise is absent, the construction of the loop filter can be relatively simple and inexpensive.

The device in accordance with the invention has the additional advantage that it can also be used to amplify analog signals, such as, for example, an analog audio signal originating from an audio cassette. Such an analog signal has to be added, for example, in an extended variant of the subtraction unit, to a digital input signal, this digital input signal not having low-frequency contents. If, in this situation, the digital input signal does have low-frequency audio contents, a mixture of the analog audio signal and the digital input signal is formed.

An embodiment of the device in accordance with the invention, in which the coupling between the output of the switching amplifier and the second input of the subtraction unit comprises a feedback unit, is characterized in that said feedback unit exhibits a substantially frequency-independent behavior. The known device is provided with an anti-aliasing filter in the feedback to relieve the time-discrete loop filter of the repetition spectra of the output signal which may lead to disturbances. By virtue of the time-continuous and linear character of the loop filter, the device in accordance with the invention is free of disturbances caused by the repetition spectra of the output signal. As a result, an anti-aliasing filter can be dispensed with. It is sufficient to use an amplifying coefficient.

A further embodiment of the device in accordance with the invention is characterized in that an input of the comparator is coupled to the input electrode. As a result, the sensitivity of the device to jitter is reduced because the instants at which the switching amplifier switches are more clearly determined now. By virtue thereof, a higher dynamic range is possible.

These and other aspects of the invention will be apparent from and elucidated with reference to the embodiments described hereinafter.

BRIEF DESCRIPTION OF THE DRAWINGS

In the drawings:

In FIGS. 1 through 4, the functional part of the device in accordance with the invention, that is the entire device with the exception of the input electrode 10 and the output electrode 20, bears reference numeral 17.

DESCRIPTION OF THE PREFERRED EMBODIMENTS

Figure 1:
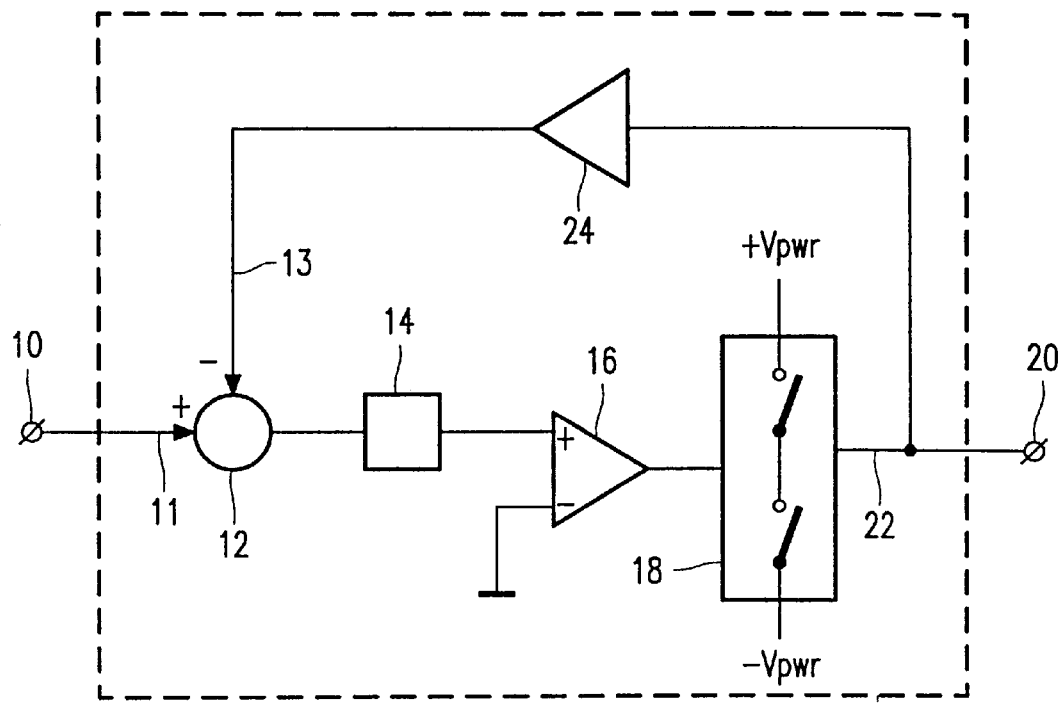
FIGS. 1 and 2 both show block diagrams of respective embodiments of a device in accordance with the invention.

FIG. 1 shows a block diagram of a device in accordance with the invention. This device can be used, for example, to amplify a digital audio signal. For example, a 16-bit pulse-code-modulated audio signal, which has been converted to an oversampled 1-bit pulse-density-modulated audio signal by means of a sigma-delta modulator or a noise shaper, can be converted to an amplified output signal by means of said device in accordance with the invention. To achieve this, the 1-bit audio signal has to be supplied to an input electrode 10 of the device. By means of a low-pass filter, for example, a non-dissipative LC filter, an analog audio signal can be filtered from the output signal amplified by the device, which is present on an output electrode 20. This low-frequency analog audio signal can subsequently be converted into sound via a loudspeaker.

The input electrode 10 is coupled to a first input 11 of a subtraction unit 12. In this subtraction unit 12, the output signal fed back via an amplifying coefficient 24 is subtracted from the 1-bit input signal. The resultant signal is subsequently amplified in a loop filter 14 and filtered, whereafter it is fed to a comparator 16. This comparator 16 controls, on the basis of the signal originating from the loop filter 14, a switching amplifier 18 in which, for example, MOSFETS can be used as the switching elements. This switching amplifier 18 is fed by means of two symmetrical supply voltages +Vpwr and −Vpwr. The control signal originating from the comparator 16 is converted by the switching amplifier 18 into a pulse-density-modulated 1-bit digital signal whose amplitude can assume the values +Vpwr and −Vpwr. This output signal, which is present on an output 22 of the switching amplifier 18, is fed out via the output electrode 20.

The use of switching amplifiers or class D amplifiers has the advantage that there is hardly any power dissipation in such amplifiers. As a result, such amplifiers have a very high efficiency. A disadvantage of switching amplifiers is the sensitivity to variations in the supply voltage. These variations determine, directly, the amplitude of the output signal. In addition, switching artefacts, caused by the imperfect nature of the switching elements, can adversely affect the output signal. It is known that these undesirable artefacts can be substantially suppressed by negative feedback of the output signal.

By feeding back the output signal of the switching amplifier 18 via the amplifying coefficient 24 to the subtraction unit 12, the control of the switching amplifier 18 by the comparator 16 is influenced such that, in case of switching artefacts or variations in the supply voltages +Vpwr and −Vpwr, the output signal of the switching amplifier 18 is corrected. This means that the width of the pulses of the pulse-density-modulated signal is varied so that the overall energy contents of the output signal remains substantially the same. Disturbances in the output signal, which originated in the switching amplifier, are reduced by the feedback by a factor which is equal to the loop gain. In this manner, the low-frequency audio signal included in the output signal is substantially insensitive to switching artefacts or variations in the supply voltages +Vpwr and −Vpwr. As a result, the degree to which low-frequency audio signals are amplified by the device is governed substantially by the amplifying coefficient 24. If this loop gain is to be equal throughout the audio-frequency range, the amplifying coefficient 24 must exhibit a substantially frequency-independent behavior. By choosing a proper value for the amplifying coefficient 24, a 100% modulated output signal can be achieved, even if the input signal is not 100% modulated and coded in the so-called return-to-zero format.

It has been found that, if the loop gain by the loop filter 14 for low frequencies is in accordance with a second-order characteristic, the dynamic range of the device can amount to at least 100 dB.

The device shown may start oscillating if the current fed via the amplifying coefficient 24 to the subtraction unit 12 is larger than the current fed via the input electrode 10 to the subtraction unit 12. To preclude this, the device may be provided with a delay element, for example, in the form of an additional low-pass filter in the loop, or with an element in which a hysteresis occurs. An example of the latter element may be a connection between the output of the comparator 16 and the positive input of the comparator 16, resulting in a positive feedback of the comparator 16.

The loop filter 14 may, for example, comprise a number of integrators. The integrating action of this loop filter 14 causes the square-wave input signal to be converted to a triangular signal of smaller amplitude. As a result, thermal noise may cause a high-frequency time uncertainty at the location of the output edges of the comparator 16. In this example, said time uncertainty is reduced by means of low-frequency negative feedback.

Figure 2:
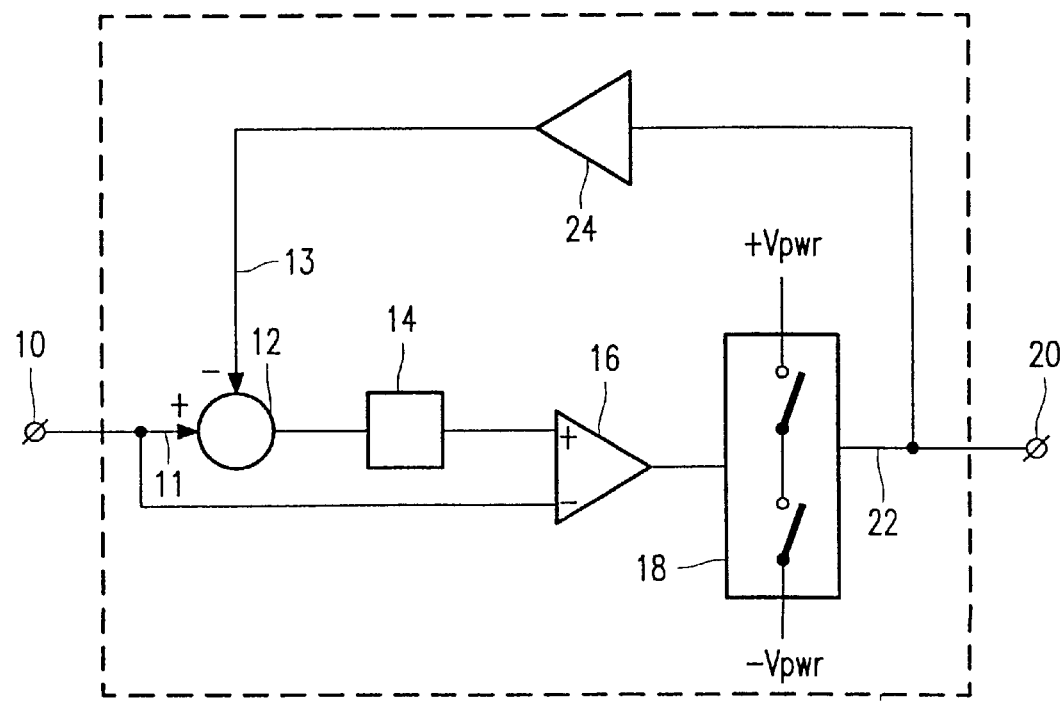

FIG. 2 shows a block diagram of an alternative embodiment of the device in accordance with the invention. The negative input of the comparator 16 is directly connected to the input electrode 10. Since, in one of the input signals of the comparator 16, the pulses are characterized by steep edges, the condition of the comparator 16, and hence also the moment the switching amplifier 18 performs a switching operation, is more clearly determined at every pulse, while the operation of the device at low frequencies remains unchanged. By virtue thereof, the sensitivity of the device to jitter is reduced, so that a higher dynamic range can be achieved.

Figure 3:
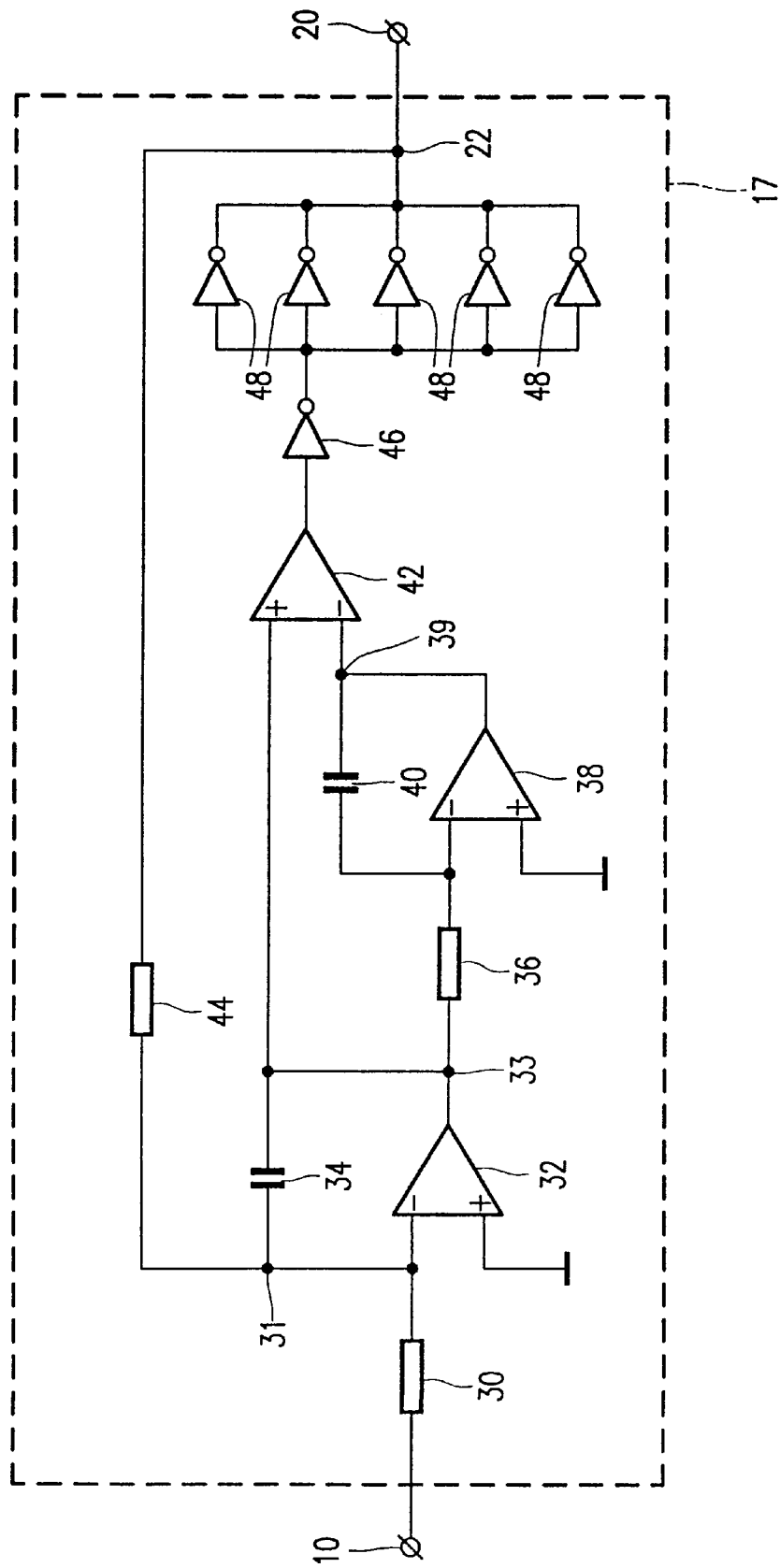
FIG. 3 shows an electrical circuit diagram of an example of a device in accordance with the invention.

FIG. 3 is an electrical circuit diagram of a device in accordance with the invention. This device can be used to convert a pulse-density-modulated digital input signal supplied to the input electrode 10 into an amplified output signal present on the output electrode 20. The digital input signal may be generated, for example, on the basis of a 16-bit pulse-code-modulated digital audio signal, by a fifth-order noise shaper in which a sampling frequency of 2.8 MHz is used.

The digital input signal is supplied to a first integrator via a resistor 30. This first integrator is formed by an operational amplifier 32 in combination with a resistor 44 and a capacitor 34. An output 33 of the first integrator is coupled to an input of a second integrator and to a positive input of a comparator 42. This second integrator is formed by an operational amplifier 38 in combination with a resistor 36 and a capacitor 40. An output 39 of the second integrator is coupled to a negative input of the comparator 42. An output of this comparator 42 is coupled to an inverter 46 which, in turn, is coupled to a parallel arrangement of five inverters 48. In this example, this combination of the inverter 46 and the parallel arrangement of inverters 48 forms the switching amplifier. An output 22 of this switching amplifier is coupled to the output electrode 22 and, via the resistor 44, to a negative input of the operational amplifier 32.

In this example, the subtraction unit is formed by the adding property of the first integrator in combination with the fact that the output signal is inverted. In addition, the amplifying coefficient is implemented by coupling the resistor 44 to the virtual ground point 31. Further, the combination of the first and second integrator and the comparator 42 form the loop filter 14, this loop filter 14 exhibiting a second-order characteristic. By means of the connection between the output 33 of the first integrator and the positive input of the comparator 42, it is ensured that at frequencies around the sampling frequency, the loop filter exhibits a first-order characteristic.

The comparator 42 does not only function as a part of the loop filter 14, but also, as the comparator 16 shown in FIGS. 1 and 2. The part of the comparator 42 which subtracts the output signal of the second integrator from the output signal of the first integrator, forms part of the loop filter 14. The part of the comparator 42 which compares the resultant signal to ground forms part of the comparator 16.

An analog audio signal originating, for example, from an audio cassette can be added, via a resistor to the virtual earth point 31, to a digital signal supplied via the input electrode 10 and the resistor 30. This analog audio signal can subsequently be amplified by the device shown.

The device shown can be integrally accommodated in an integrated circuit, and it is also possible, for example, to add a noise shaper to said integrated circuit. Said integrated circuit can be constructed, for example, using CMOS or SOI technology.

Figure 4:
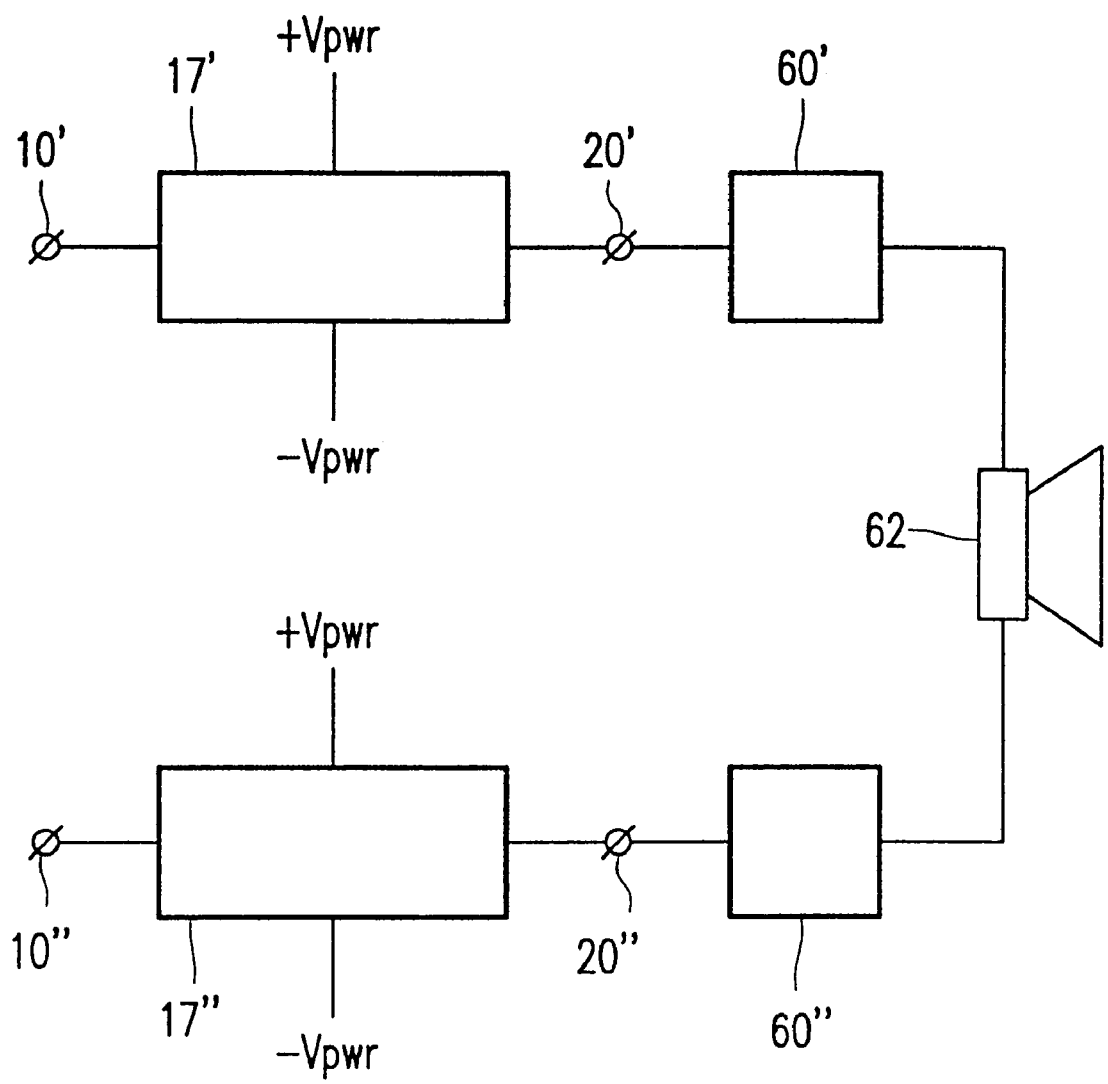
FIG. 4 shows a block diagram of an example of a bridge amplifier comprising two devices in accordance with the invention.

FIG. 4 shows a block diagram of a bridge amplifier comprising two devices in accordance with the invention. A first device is formed by an input electrode 10', a functional part 17' and an output electrode 20'. In a low-pass filter 60', a first low-frequency analog audio signal is filtered from a first digital audio signal amplified by this first device, and, subsequently, said low-frequency analog audio signal is supplied to a first input of a loudspeaker 62. A second device is formed in an analogous manner by an input electrode 10", a functional part 17" and an output electrode 20". In a low-pass filter 60", a second low-frequency analog audio signal is filtered from a second digital audio signal amplified by this second device, and, subsequently, this low-frequency analog audio signal is supplied to a second input of the loudspeaker 62.

By ensuring that the low-frequency contents of the first and second digital audio signal are in phase opposition, for example, by deriving the second digital audio signal from the first digital audio signal by means of an inverter, it is achieved that also the first and second low-frequency analog audio signal are in phase opposition. By virtue thereof, the loudspeaker 62 is effectively operated with a double-amplitude analog signal, thus causing the power reproduced by the loudspeaker 62 to be quadruple.

What is claimed is:

1. A method for amplifying digital signals, said method comprising the steps:

receiving a digitally encoded signal;

feeding back an amplified version of the digitally encoded signal;

amplifying said fed back amplified version of the digitally encoded signal;

subtracting said amplified fed back amplified version of the digitally encoded signal from the received digitally encoded signal forming a resultant signal;

time-continuously filtering the resultant signal;

time-continuously comparing the filtered resultant signal with a reference signal forming a control signal; and controlling a switching amplifier with said control signal to form said amplified version of said digitally encoded signal.

2. The method as claimed in claim 1, wherein in said subtracting step, said amplified version of said digitally encoded signal is fed back from said switching amplifier substantially independent of frequency.

3. The method as claimed in claim 1, characterized in that in said time-continuous comparing step, said reference signal is said digitally encoded signal.

* * * * *